United States Patent
Juan

(10) Patent No.: US 7,293,464 B1
(45) Date of Patent: Nov. 13, 2007

(54) INSULATED IC PRESSURE SENSOR

(76) Inventor: Chih-Chen Juan, No.279 Xi-Nan Road, Wu-Ri Xiang, Taichung County (TW)

( * ) Notice: Subject to any disclaimer, the term of this patent is extended or adjusted under 35 U.S.C. 154(b) by 0 days.

(21) Appl. No.: 11/480,200

(22) Filed: Jun. 29, 2006

(51) Int. Cl.
*G01L 9/00* (2006.01)

(52) U.S. Cl. .......................................... 73/754; 73/753

(58) Field of Classification Search ................. 73/753, 73/754
See application file for complete search history.

(56) References Cited

U.S. PATENT DOCUMENTS 5,095,349 A * 3/1992 Fujii et al. ................. 257/108
5,320,705 A * 6/1994 Fujii et al. ..................... 438/51
6,218,717 B1 * 4/2001 Toyoda et al. .............. 257/419

* cited by examiner

*Primary Examiner*—Andre J. Allen
(74) *Attorney, Agent, or Firm*—Pro-Techtor Int'l Services

(57) ABSTRACT

An insulated IC pressure sensor comprises a main body, enclosing a chamber, having a hole for letting in fluid pressure of which is to be sensed, a pressure-sensing integrated circuit (IC), placed inside the chamber, and a membrane, placed inside the chamber between the hole and the pressure-sensing IC, tightly sealing the pressure-sensing IC from a remainder of the chamber, creating a sealed space between the pressure-sensing IC and the membrane filled with electrically insulating fluid, so that sensing pressure of electrically conducting fluid will not directly contact and hence not adversely affect the pressure-sensing IC by short-circuits.

4 Claims, 8 Drawing Sheets

INSULATED IC PRESSURE SENSOR

BACKGROUND OF THE INVENTION

1. Field of the Invention

The present invention relates to an insulated IC pressure sensor, particularly to an insulated IC pressure sensor using a pressure-sensitive integrated circuit (IC) as a pressure sensor for sensing pressure of an electrically conducting fluid.

2. Description of Related Art

Conventional pressure sensors for fluids are mercury pressure sensors or mechanical pressure sensors using springs. However, mechanical pressure sensors are voluminous and expensive and have bad reactivity and reactivity. Therefore, in recent years semiconductor pressure sensors have been developed.

A conventional semiconductor pressure sensor uses a pressure-sensitive integrated circuit (IC), comprising, as shown on FIG. 7, a base 1; an adapter 2 on an upper side of the base 1 for connecting to a pipe and letting in fluid; an electronic circuit board 3 on the upper side of the base 1; a pressure-sensing IC 4, having several feet soldered to the electronic circuit board 3; several wires 5, connected to the electronic circuit board 3 for transmitting pressure data to an external processing device; and a cover 6, placed on the upper side of the base 1 and protecting the electronic circuit board 3 and the pressure-sensing IC.

The pressure-sensing IC 4 has several pressure-sensitive resistors having electrical resistance values that vary with varying pressure.

A conventional semiconductor pressure sensor is directly contacted by fluid the pressure of which is to be sensed and hence suitable for measuring air pressure, but due to risk of short-circuits becomes ineffective if the fluid is electrically conducting.

Since electrically conducting fluid has to be kept insulated from the pressure-sensing IC, pressure-transmitting devices like pistons have been employed to measure pressure of electrically conducting fluid, like water or oil. As shown in FIG. 8, a case 7 is put over the base 1, housing a piston 8 with an outer side, against which fluid presses causing a movement of the piston 8. Air is used to transmit pressure from the piston 8 to the pressure-sensing IC 4, so that pressure of the fluid is sensed indirectly.

Damaging of the pressure-sensing IC 4 by electrically conducting fluid is thereby avoided, but the case 7 and the piston 8 lead to dissipation of mechanical energy, lack of sensing precision and, due to usage of transmitting compressed air, temperature dependence of sensed pressure values. Furthermore, friction of the movement of the piston 8 causes the piston 8 after a release of pressure to return to a position different from an original position, resulting in poor repeatability.

Therefore, direct sensing of fluid pressures is not possible in many cases, limiting the range of applications, and indirect sensing is imprecise.

SUMMARY OF THE INVENTION

The main object of the present invention is to provide an insulated IC pressure sensor which allows to sense pressure of an electrically conducting fluid by direct contact.

For achieving this object, the insulated IC pressure sensor of the present invention has a pressure-sensing integrated circuit (IC), placed inside a chamber, and a membrane, placed inside the chamber between an inlet hole and the pressure-sensing IC, tightly sealing the pressure-sensing IC from a remainder of the chamber, creating a sealed space between the pressure-sensing IC and the membrane filled with electrically insulating fluid, so that sensing pressure of electrically conducting fluid will not directly contact and hence not adversely affect the pressure-sensing IC by short-circuits and no further mechanical pressure-transmitting device is required.

The present invention can be more fully understood by reference to the following description and accompanying drawings.

DETAILED DESCRIPTION OF THE PREFERRED EMBODIMENTS

As shown in FIGS. 1-4, the insulated IC pressure sensor of the present invention comprises: a main body 10; an electric circuit 30; a pressure-sensing IC 31; and a membrane 20.

The main body 10 has a base 11 and a cover 12. The cover 12 is set on an inner side of the base 11. The base 11 has a depression that forms a chamber 13. An adapter 14 is attached to the base 11, allowing to connect a pipe. A hole 15 in the adapter allows fluid pressure of which is to be sensed to flow into the chamber 13.

The electronic circuit board 30 is placed inside the main body 10 and carries the pressure-sensing IC 31, which is soldered thereto. The pressure-sensing IC 31 works as conventional art. The electronic circuit board 30 has a far end that extends outside of the main body 10 and has wires 32 and contact terminals 33 for transmitting pressure data to an external device.

Referring to FIG. 1, the pressure-sensing IC 31 is placed on the electronic circuit board 30 on a part thereof that lies inside the main body 10 and is aligned with the hole 15, so that pressure of fluid that has entered the chamber 13 through the hole 15 is readily applied to the pressure-sensing IC 31, so that the pressure-sensing IC 31 senses pressure values of fluid inside the chamber 13.

The main characteristic of the present invention is the membrane 20. The membrane 20 covers the pressure-sensing IC 31. On an inner side of the membrane 20, an electrically insulating fluid 23 is inserted, which transmits pressure on an outer side of the membrane 20 to the pressure-sensing IC 31. As shown on FIG. 3, in a first embodiment of the present invention, the membrane 20 has a semicircular depression 21 and a peripheral flange 22, allowing completely to cover the pressure-sensing IC 31. The flange 22 leans against an inner side of the base 11 and is tightly connected with a surface of the electronic circuit board 30, so that electrically insulating fluid 23 will not leak out.

Referring to FIGS. 2 and 3, for mounting the membrane 20, the membrane 20 is, using the base 11, pressed against the surface of the electronic circuit board 30 to be tightly connected therewith. As shown in FIG. 2, the surface of the electronic circuit board 30 on which the membrane 20 is laid faces the base 11. Furthermore, as shown in FIG. 3, a circular groove 16 is cut into the inner side of the base 11, accommodating the flange 22 of the membrane 20. The cover 12 is fastened to the base 11 by screws 17. In a fastened state, the base 11 presses against the flange 22 of the membrane 20, which is in turn pressed against the surface of the electronic circuit board 30, so that a tight connection is achieved.

Referring to FIG. 4, the adapter 14 on the main body 10 is connected with a pipe. The pipe allows to transmit pressure of fluid through the hole 15 in the adapter 14. When pressure has reached the chamber 13, nevertheless, due to the membrane 20, there is no direct contact between fluid and the pressure-sensing IC 31 of the electronic circuit board 30. Upon pressure, the depression 21 of the membrane 20 is deformed elastically, hence the electrically insulating fluid 23 is compressed, transmitting pressure from the membrane 20 to the pressure-sensing IC 31, so that pressure values at the membrane 20 are sensed. Insulation by the membrane and the electrically insulating fluid 23 prevents electrically conducting fluid that has entered the chamber 13 through the hole 15 to contact the pressure-sensing IC 31 directly, so that no short-circuit will result. Therefore, sensing water and oil pressure is readily performed, without any requirement of mechanical devices for transmitting pressure, so that sensing precision is not impaired.

Referring to FIG. 5, the present invention in a second embodiment comprises: a main body 60; an electric circuit 30A; a pressure-sensing IC 31A; and a membrane 80. The main body 60, has a base 61 and a cover 62, which enclose a chamber 63. An adapter 64 is attached to the base 61, having a central hole 65, which allows fluid to enter the chamber 63. The electronic circuit board 30A is placed inside the chamber 63 and has a far end that extends outside of the main body 60. The electronic circuit board 30A carries the pressure-sensing IC 31 and serves as a connection to an external device.

The first and second embodiments of the present invention differ in mounting and fastening of structural parts thereof. The membrane 80 of the second embodiment is a circular elastic plate, mounted inside the chamber 63 between the electronic circuit board 30A and the hole 65 and fastened by a fastening element 70, so that no fluid entering through the hole 65 will contact the pressure-sensing IC 31.

Referring to FIGS. 5-6, the fastening element 70 is shaped like a tube, having a first end that leans against the membrane 80, surrounding a periphery thereof, and a second end, which is via a sealing ring 71 tightly connected with a surface of the electronic circuit board 30A.

The membrane 80 and the electronic circuit board 30A the pressure-sensing IC 31 enclose a closed space, which is filled with an electrically insulating fluid 72. Thereby, pressure on the membrane 80 is transmitted to the pressure-sensing IC 31.

While the invention has been described with reference to preferred embodiments thereof, it is to be understood that modifications or variations may be easily made without departing from the spirit of this invention which is defined by the appended claims.

Figure 1:
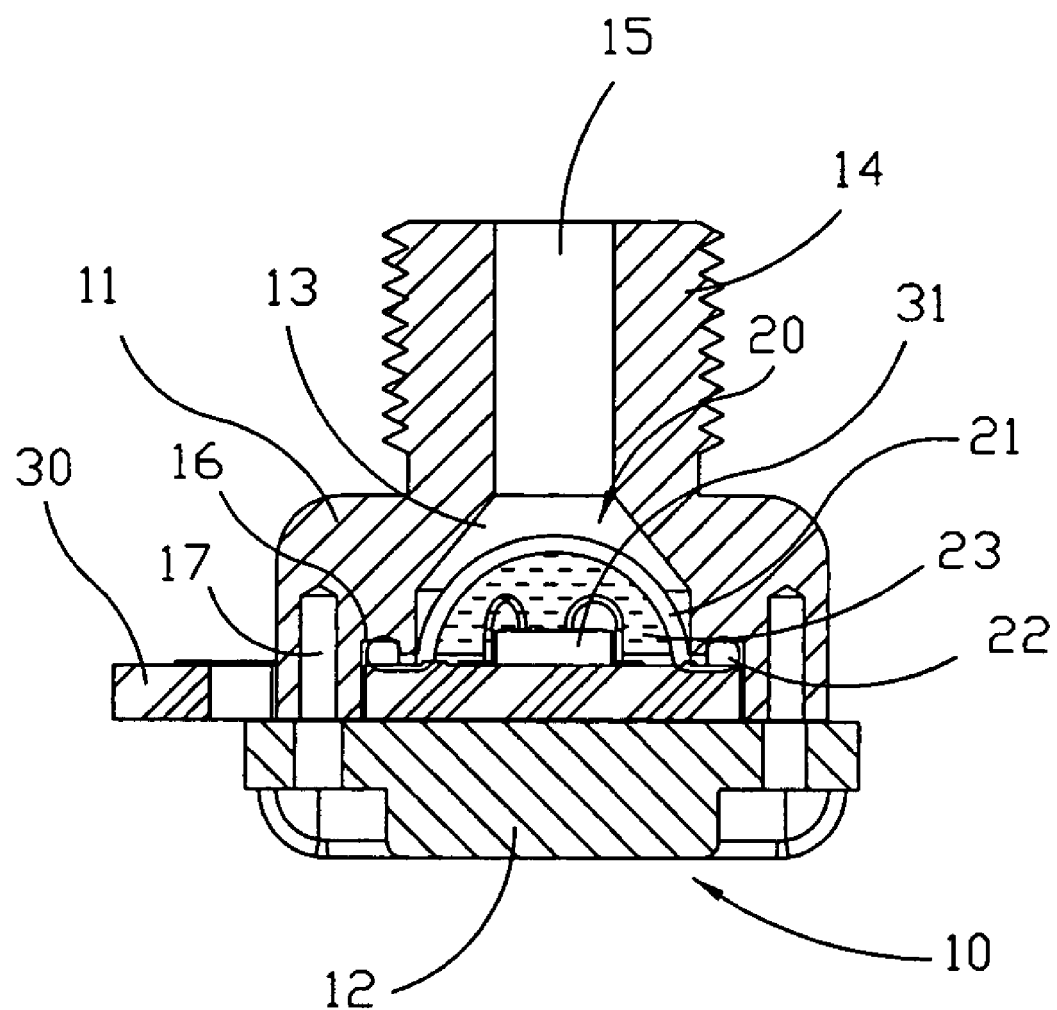
FIG. 1 is a sectional view of the insulated IC pressure sensor of the present invention in the first embodiment.
Figure 2:
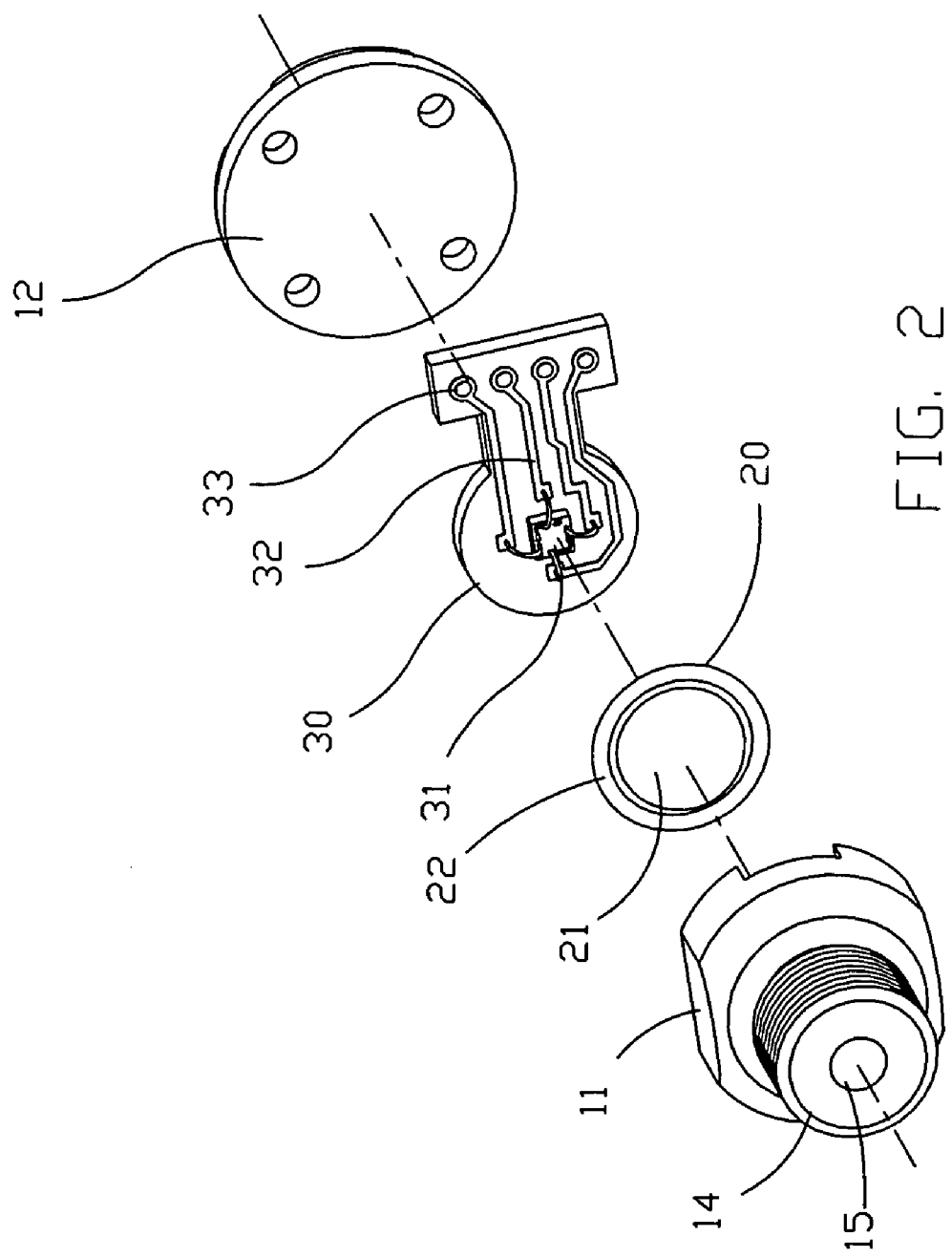
FIG. 2 is a perspective view of the insulated IC pressure sensor of the present invention in the first embodiment when disassembled.
Figure 3:
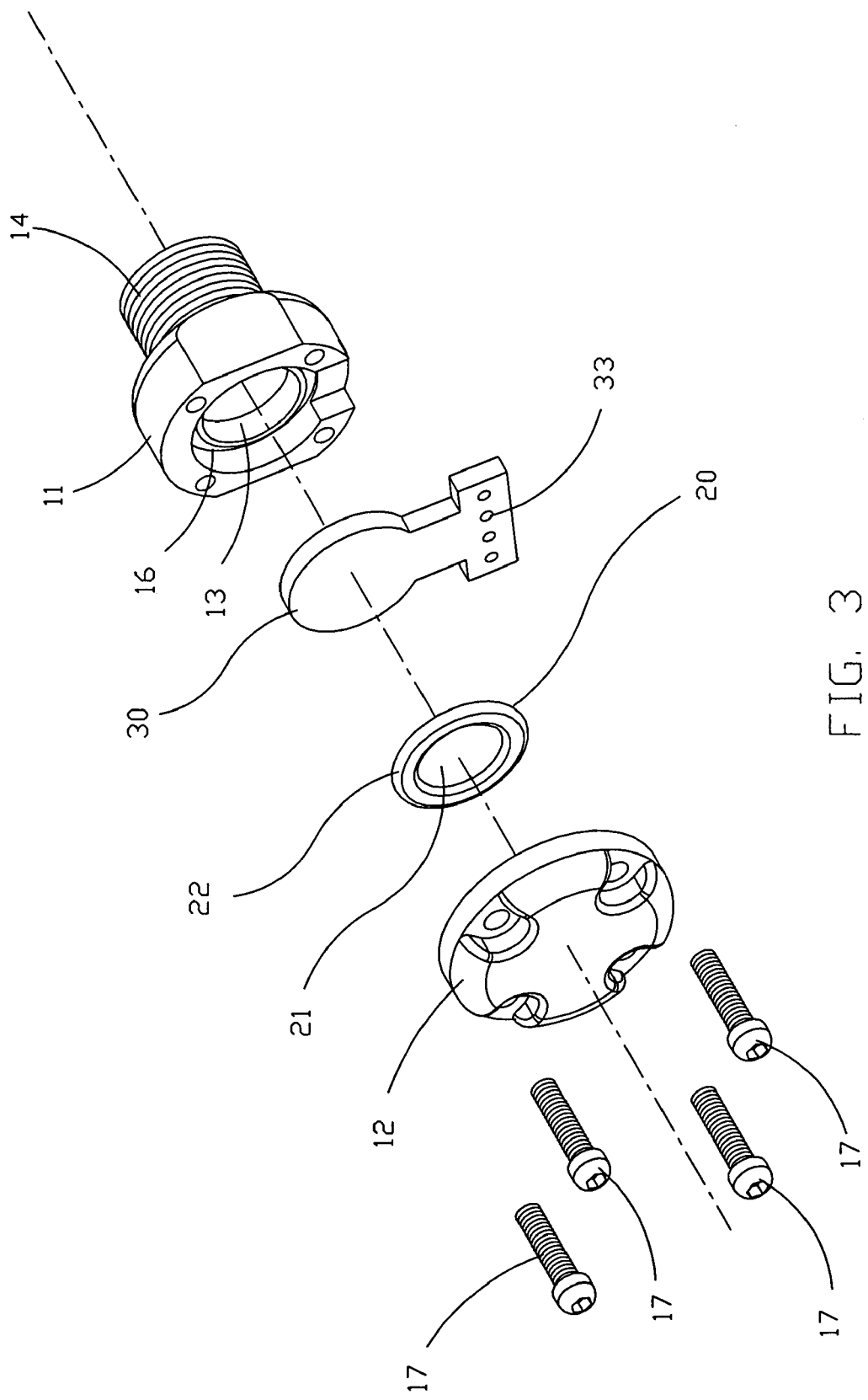
FIG. 3 is a perspective view from another direction of the insulated IC pressure sensor of the present invention in the first embodiment when disassembled.
Figure 4:
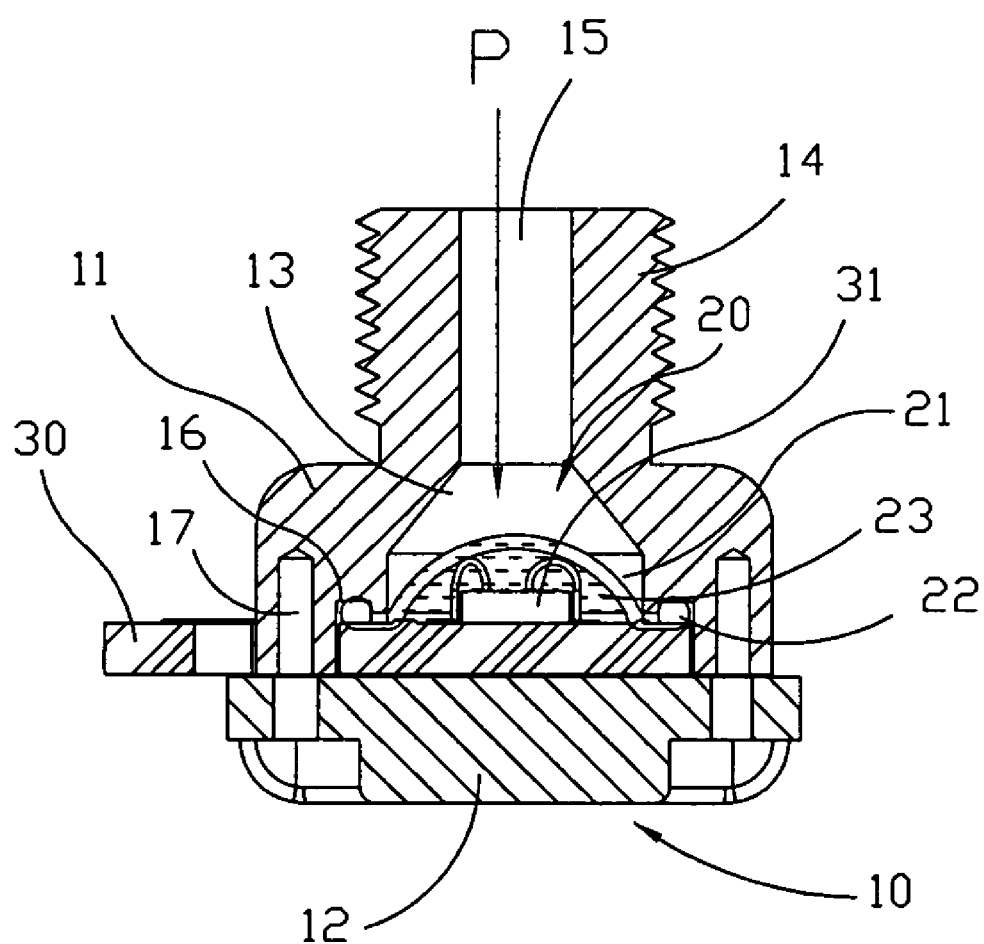
FIG. 4 is a schematic illustration of using the present invention in the first embodiment.
Figure 5:
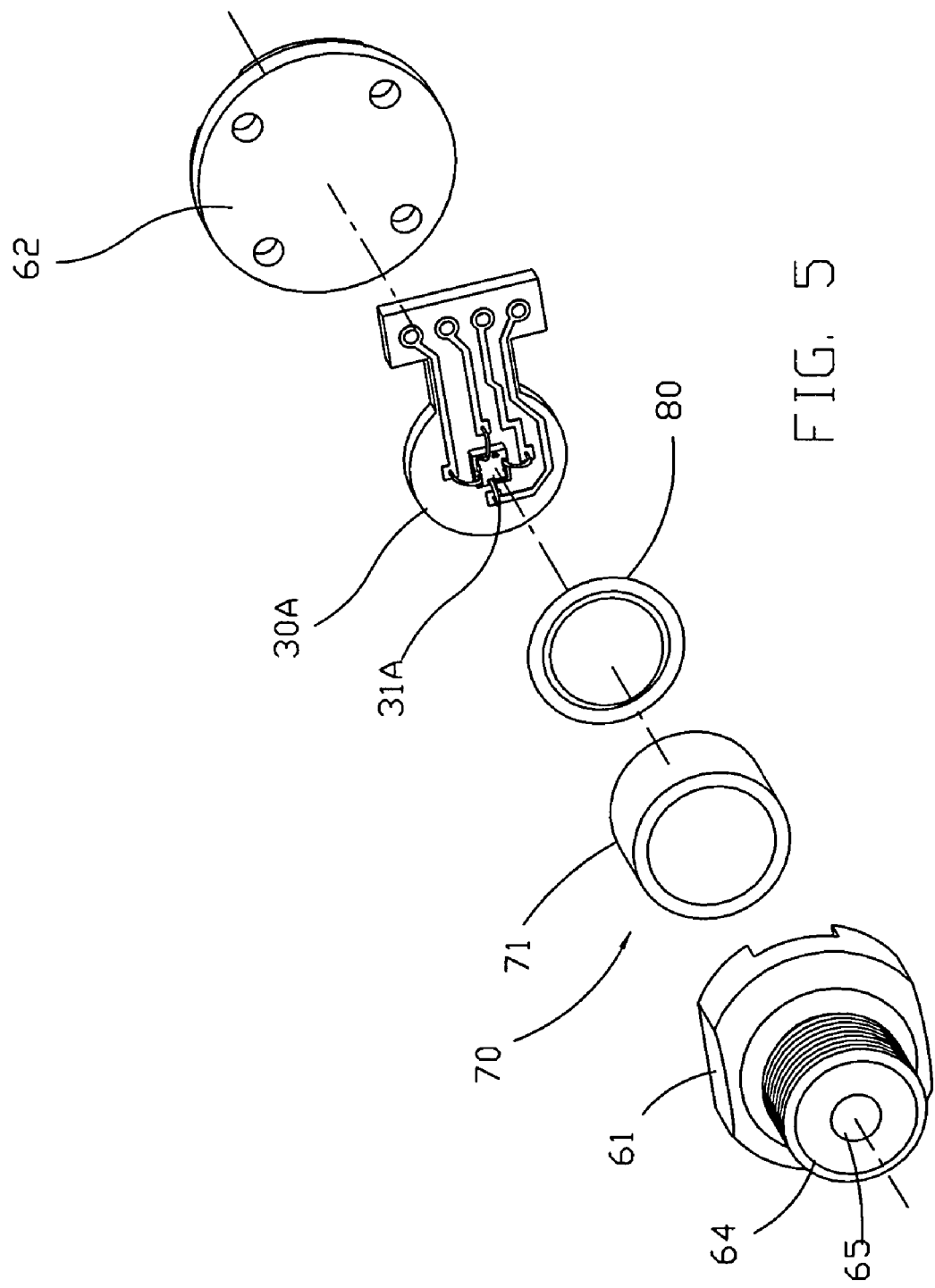
FIG. 5 is a perspective view of the insulated IC pressure sensor of the present invention in the second embodiment when disassembled.
Figure 6:
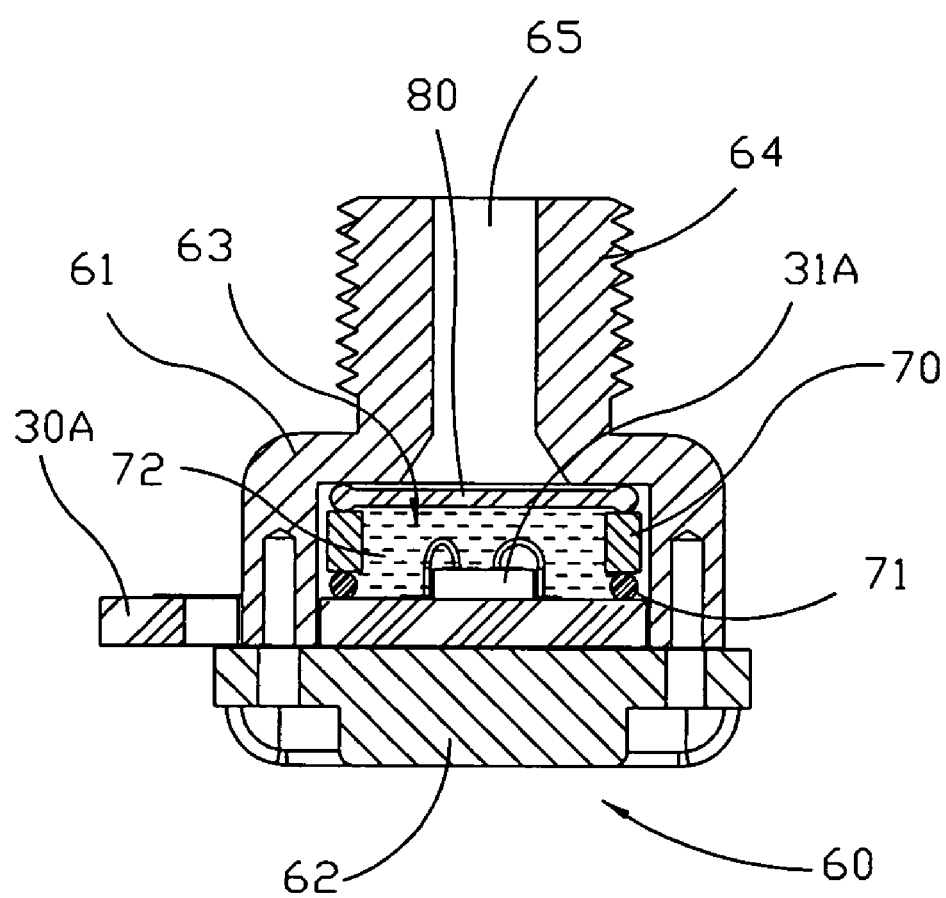
FIG. 6 is a sectional view of the insulated IC pressure sensor of the present invention in the second embodiment.
Figure 7:
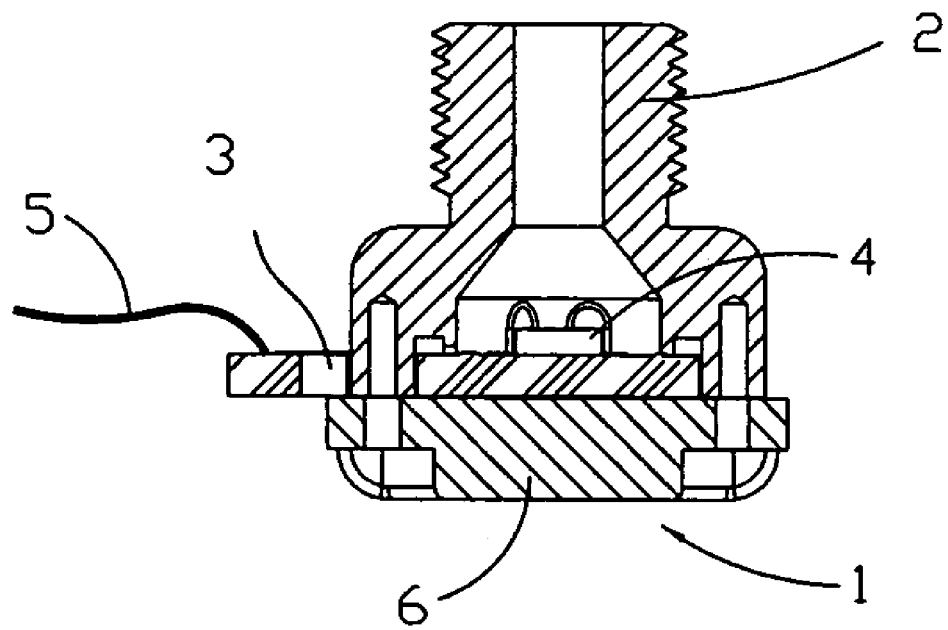
FIG. 7 (prior art) is a schematic illustration of a conventional semiconductor pressure sensor.
Figure 8:
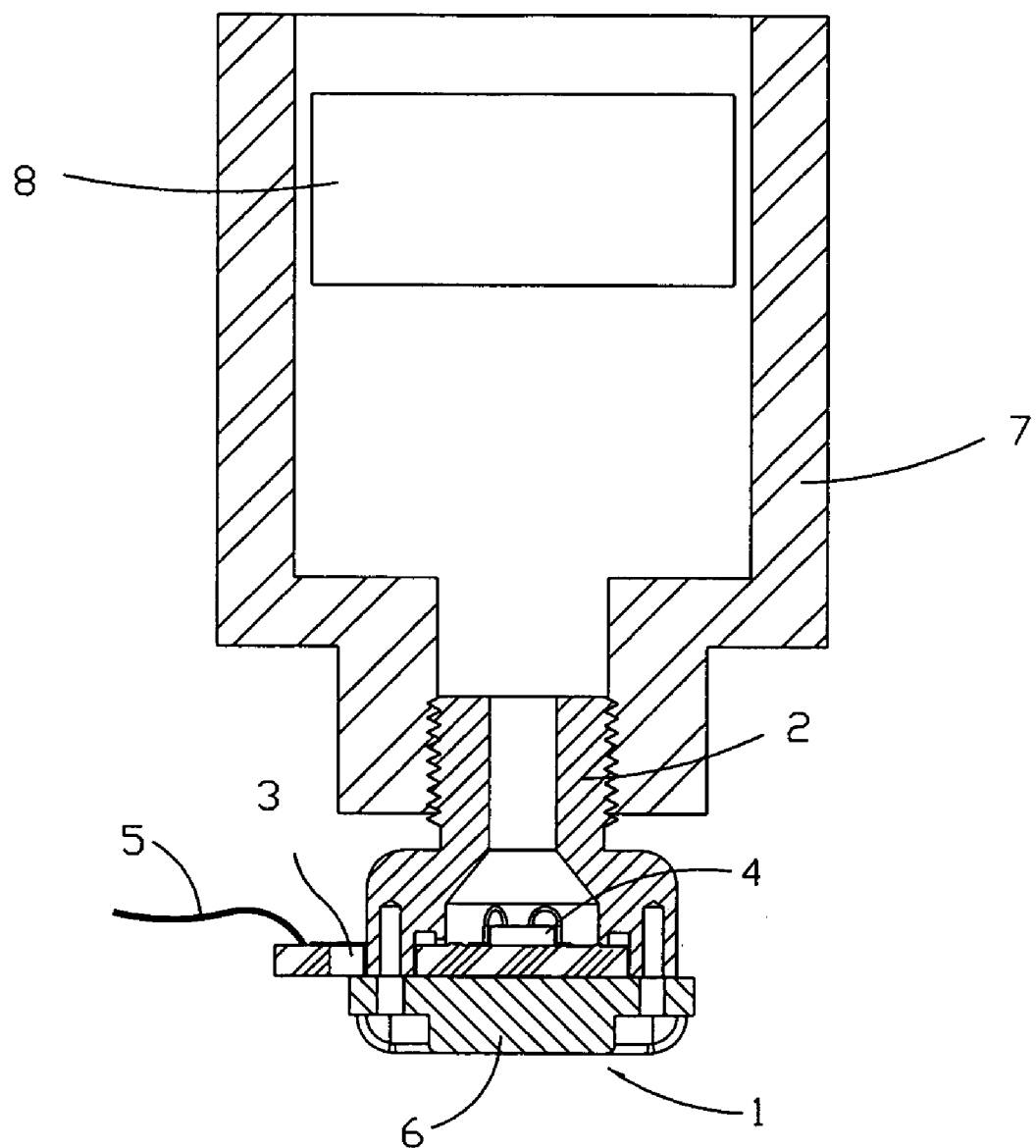
FIG. 8 (prior art) is a schematic illustration of a conventional semiconductor pressure sensor for sensing pressure of an electrically conducting fluid.

The invention claimed is:

1. A insulated IC pressure sensor, comprising
   a main body, having a base and a cover, which enclose a chamber, said base having a hole for letting in fluid pressure of which is to be sensed;
   a pressure-sensing integrated circuit (IC), placed inside said chamber; and
   a membrane, placed inside said chamber between said hole and said pressure-sensing IC, tightly sealing said pressure-sensing IC from a remainder of said chamber, creating a sealed space between said pressure-sensing IC and said membrane filled with electrically insulating fluid, so that said membrane is deformed by pressure of fluid, said electrically insulating fluid transmits pressure to said pressure-sensing IC, which accordingly senses pressure of fluid in said remainder of said chamber;
   wherein sensing pressure of electrically conducting fluid will not directly contact and hence not adversely affect said pressure-sensing IC by short-circuits.

2. The insulated IC pressure sensor according to claim 1, wherein said pressure-sensing IC is mounted on an electronic circuit board.

3. The insulated IC pressure sensor according to claim 1, wherein said membrane has a circular depression, covering said pressure-sensing IC, and a peripheral flange that is tightly sealed against said electronic circuit board, so that said sealed space is created.

4. The insulated IC pressure sensor according to claim 1, wherein said membrane is fastened inside said chamber by a fastening element, so that said chamber is divided into said sealed space filled with said electrically insulating fluid and said remainder of said chamber.

* * * * *